(12) United States Patent
Dunstan et al.

(10) Patent No.: US 7,852,889 B2
(45) Date of Patent: Dec. 14, 2010

(54) ACTIVE SPECTRAL CONTROL OF DUV LIGHT SOURCE

(75) Inventors: Wayne J. Dunstan, San Diego, CA (US); Robert N. Jacques, San Diego, CA (US); Rajasekhar M. Rao, San Diego, CA (US); Fedor B. Trintchouk, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 145 days.

(21) Appl. No.: 11/510,037

(22) Filed: Aug. 25, 2006

(65) Prior Publication Data

US 2007/0195836 A1 Aug. 23, 2007

Related U.S. Application Data

(60) Provisional application No. 60/774,770, filed on Feb. 17, 2006.

(51) Int. Cl.
- H01S 3/086 (2006.01)
- H01S 3/097 (2006.01)
- H01S 3/1055 (2006.01)
- H01S 3/22 (2006.01)

(52) U.S. Cl. ............. 372/38.01; 372/29.02; 372/38.07; 372/55; 372/57; 372/102

(58) Field of Classification Search ............ 372/55, 372/57, 102, 38.01, 29.02, 38.07
See application file for complete search history.

(56) References Cited

U.S. PATENT DOCUMENTS

| 4,823,354 | A | 4/1989 | Znotins et al. ............. 372/57 |
| 4,881,231 | A | 11/1989 | Jain ........................ 372/32 |
| 6,005,879 | A | 12/1999 | Sandstrom et al. .......... 372/25 |
| 6,490,308 | B2 | 12/2002 | Albrecht et al. ............ 372/59 |
| 6,493,374 | B1 * | 12/2002 | Fomenkov et al. ......... 372/102 |
| 6,721,340 | B1 * | 4/2004 | Fomenkov et al. .......... 372/25 |
| 6,856,638 | B2 * | 2/2005 | Aab et al. .................. 372/57 |

(Continued)

FOREIGN PATENT DOCUMENTS

WO WO 01/28048 4/2001

OTHER PUBLICATIONS

U.S. Appl. No. 60/774,770, filed Feb. 17, 2006, Dunstan et al.

(Continued)

*Primary Examiner*—Minsun Harvey
*Assistant Examiner*—Michael Carter

(57) ABSTRACT

According to aspects of an embodiment of the disclosed subject matter, a line narrowed high average power high pulse repetition laser micro-photolithography light source bandwidth control method and apparatus are disclosed which may comprise a bandwidth metrology module measuring the bandwidth of a laser output flight pulse beam pulse produced by the light source and providing a bandwidth measurement; a bandwidth error signal generator receiving the bandwidth measurement and a bandwidth setpoint and providing a bandwidth error signal; an active bandwidth controller providing a fine bandwidth correction actuator signal and a coarse bandwidth correction actuator signal responsive to the bandwidth error. The fine bandwidth correction actuator and the coarse bandwidth correction actuator each may induce a respective modification of the light source behavior that reduces bandwidth error. The coarse and fine bandwidth correction actuators each may comprise a plurality of bandwidth correction actuators.

21 Claims, 8 Drawing Sheets

U.S. PATENT DOCUMENTS

| | | | |
|---|---|---|---|
| 2002/0048288 A1 | 4/2002 | Kroyan et al. | 372/20 |
| 2002/0154668 A1* | 10/2002 | Knowles et al. | 372/55 |
| 2003/0118072 A1 | 6/2003 | Wittak et al. | 372/58 |
| 2003/0161373 A1 | 8/2003 | Kitatochi et al. | 372/55 |
| 2004/0057489 A1* | 3/2004 | Fallon et al. | 372/57 |
| 2005/0094698 A1 | 5/2005 | Besaucele et al. | 372/57 |
| 2005/0185690 A1 | 8/2005 | Rule et al. | 372/55 |
| 2006/0114956 A1 | 6/2006 | Sandstrom et al. | 372/55 |
| 2006/0114958 A1 | 6/2006 | Trintchouk et al. | 372/55 |
| 2006/0146900 A1 | 7/2006 | Jacques et al. | 372/38.1 |
| 2007/0001127 A1 | 1/2007 | Reiley et al. | 250/492.2 |
| 2007/0013913 A1 | 1/2007 | Rafac | 356/451 |

OTHER PUBLICATIONS

Huggins, et al, "Effects Of Laser Bandwidth On OPE In A Modern Lithography Tool," *Optical Microlithography XIX*, Donis G. Flagello, Editor, Proc., Of SPIE vol. 6154 6154Z (2006).

Ishihara, et al, " XLA-200: The Third-Generation ArF MOPA Light Source For Immersion Lithography", *Optical Microlithography XVIII*, Bruce W. Smith, Editor, Proceedings of SPIE, vol. 5754, pp. 773-779 (2005).

Rafac, et al, "Overcoming Limitations Of Etalon Spectrometers Used For Spectral Metrology of DUV Excimer Light Sources", *Optical Microlithography XVIII*, Bruce W. Smith, Editor, Proceedings of SPIE, vol. 5377, pp. 846-858 ( 2004).

European Search Report dated Jun. 7, 2009, EP Patent Application No. 07716893.8 filed Jan. 22, 2007 (7 pages).

* cited by examiner

ACTIVE SPECTRAL CONTROL OF DUV LIGHT SOURCE

CROSS-REFERENCE TO RELATED APPLICATIONS

The present application claims priority to U.S. Provisional Patent Application, Ser. No. 60/774,770, entitled ACTIVE SPECTRAL CONTROL OF DUV LIGHT SOURCES FOR OPE MINIMIZATION, filed on Feb. 17, 2006; and is also related to co-pending patent application Ser. No. 11/254,282, entitled METHOD AND APPARATUS FOR GAS DISCHARGE LASER BANDWIDTH AND CENTER WAVELENGTH CONTROL, filed on Oct. 20, 2005, Published on Jun. 6, 2006, Pub. No. US20060114958, and is also related to Ser. No. 11/323,604, entitled MULTI-CHAMBER GAS DISCHARGE LASER BANDWIDTH CONTROL THROUGH DISCHARGE TIMING, filed on Dec. 29, 2005; and is related to Ser. No. 11/173,988, entitled ACTIVE BANDWIDTH CONTROL FOR A TUNED LASER, filed on Jun. 30, 2005; and related to Ser. No. 11/169,202, filed on Jun. 27, 2005, entitled SPECTRAL METROLOGY FOR HIGH REPETITION RATE GAS DISCHARGE LASER; and to Ser. No. 11/035,938, filed on Jan. 13, 2005, entitled METHOD AND APPARATUS FOR CONTROLLING THE OUTPUT OF A GAS DISCHARGE MOPA LASER SYSTEM; and is related to Ser. No. 11/000,571, filed on Nov. 30, 2004, entitled HIGH POWER HIGH PULSE REPETITION RATE GAS DISCHARGE LASER SYSTEM BANDWIDTH MANAGEMENT, and is related to Ser. No. 10/953,100, filed on May 5, 2005, entitled MULTI-CHAMBERED EXCIMER OR MOLECULAR FLUORINE GAS DISCHARGE LASER FLUORINE INJECTION CONTROL, filed on Sep. 29, 2004, the disclosures of each of which are hereby incorporated by reference.

FIELD OF THE DISCLOSED SUBJECT MATTER

The disclosed subject matter related to active control of bandwidth, e.g., in a DUV gas discharge laser system, e.g., an excimer or molecular fluorine laser system used, e.g., in a line narrowed application, e.g., as a laser light source for integrated circuit manufacturing in photolithography.

BACKGROUND

Certain photolithography parameters, e.g., the variation of critical dimension ("CD") printed with pitch, otherwise sometimes referred to as Optical Proximity Effect (OPE), e.g., in a scanner imaging system, shows a behavior that is characteristic of the imaging and process conditions and is sensitive to variations in those conditions. Maintaining stable process conditions can improve the effectiveness of mask Optical Proximity Correction (OPC). One of the factors which affects the OPE is the spectral bandwidth of the light source. To date, passive bandwidth stabilization techniques have been effective in meeting OPE control requirements. However, future tighter OPE specifications will require advanced bandwidth control techniques. According to aspects of an embodiment of the disclosed subject matter applicants propose developments in active stabilization of bandwidth, e.g., in single chambered laser systems, such as applicants' assignee's Cymer 7XXX laser systems, e.g., the 7010 and/or in dual chamber laser systems, e.g., master oscillator and amplifier gain medium laser systems such as master oscillator-power amplifier ("MOPA") such as Cymer XLA 1XX, 2XX or 3XX laser systems or master oscillator power oscillator ("MOPO") laser systems.

The recent work of Huggins et al., "Effects of laser bandwidth on OPE in a modern lithography tool.", Optical Microlithography XVIII (2006), describes how controlling the spectral properties of the laser light, specifically $E_{95}$ bandwidth, has an effect of similar magnitude to those from other control parameters, such as focus shift, dose shift and partial coherence shift. The bandwidth metric, $E_{95}$, is defined as the width of the spectrum (typically in picometers) that contains 95% of the integrated spectral intensity. A second bandwidth metric that is commonly employed is the Full Width at Half-Maximum (FWHM), which, although easier to measure than $E_{95}$, does not affect OPE as significantly.

To date, as noted, passive bandwidth stabilization techniques have been effective in meeting OPE control requirements. However, applicants believe that future tighter OPE specifications will require active control techniques to not only improve the stability of $E_{95}$ bandwidth, but also regulate $E_{95}$ bandwidth to a desired setpoint (i.e., within a selected very narrow range. FIG. 6 by way of example relates the concepts of stability and setpoint regulation to those of passive and active control. The left most plot (Nominal) depicts the $E_{95}$ variability versus time as a system baseline. The middle plot (Passive) illustrates that with passive improvements one may, e.g., aim to improve $E_{95}$ stability, reduce the $E_{95}$ variability, and usually lower the $E_{95}$ setpoint. The right most plot (Active) illustrates by way of example that the aim of active control methods is to further refine the $E_{95}$ stability and variability, and allow dynamic selection of the $E_{95}$ set point.

Lambda Physik AG patent U.S. Pat. No. 6,490,308 discusses various means for extending gas life.

SUMMARY

According to aspects of an embodiment of the disclosed subject matter, a line narrowed high average power high pulse repetition laser micro-photolithography light source bandwidth control method and apparatus are disclosed which may comprise a bandwidth metrology module measuring the bandwidth of a laser output light pulse beam pulse produced by the light source and providing a bandwidth measurement; a bandwidth error signal generator receiving the bandwidth measurement and a bandwidth setpoint and providing a bandwidth error signal; an active bandwidth controller providing a fine bandwidth correction actuator signal and a coarse bandwidth correction actuator signal responsive to the bandwidth error. The fine bandwidth correction actuator and the coarse bandwidth correction actuator each may induce a respective modification of the light source behavior that reduces bandwidth error. The coarse and fine bandwidth correction actuators each may comprise a plurality of bandwidth correction actuators. The coarse bandwidth correction actuator targeting large amplitude disturbances occurring at low frequency and the fine bandwidth correction actuator targeting small amplitude disturbances occurring at high frequency. The large amplitude disturbances comprising one or more of the group of large $E_{95}$ setpoint changes, gas aging effects and the long timescale component of duty cycle setpoint changes, and the smaller amplitude disturbances comprising one or more of the group comprising laser system output pulse energy setpoint, and the fast component of duty cycle setpoint changes. The apparatus and method may comprise use of fine actuator control output trends towards a minimum or maximum value; coarse actuator control applies corrective action in such a way as to move the fine actuator back towards a centered value. The centered value may comprise nominally 50% where control authority is balanced in both the positive and negative directions. According to aspects of an embodiment of the disclosed subject matter a line narrowed high average power high pulse repetition laser micro-photolithography light source bandwidth control method and apparatus is disclosed which may comprise a laser operating parameter metrology module measuring the laser operating parameter of a laser output light pulse beam pulse produced by the light source and providing a laser operating parameter measurement; a laser operating parameter error signal generator receiving the laser operating parameter measurement and a laser operating parameter setpoint and providing a laser operating parameter error signal; a laser operating parameter error signal modifier modifying the laser operating parameter error signal according to the sensitivity of the laser operating parameter to another laser operating parameter comprising a real time estimation filter. The laser operating parameter error signal modifier may modify the laser operating parameter error signal according to the sensitivity of the laser operating system parameter to a each of a plurality of other laser operating parameters. The laser operating parameter may be selected from the group comprising bandwidth ($E_{xx}$), bandwidth (FWXM), energy out of the seed laser ($E_{MO}$), differential firing time between the seed laser and amplifier gain medium (dtMOPA), and voltage (V). The other laser operating parameter may be selected from the group comprising duty cycle (DC) and laser system output energy ($E_{sht}$) and voltage (V). The error signal modifier may comprise a recursive filter, e.g., an RLS filter, which also may implement the following:

$$K \equiv \frac{\lambda^{-1} P[n-1] u[n]}{1 + \lambda^{-1} u^T[n] P[n-1] u[n]}$$

$$e \equiv d[n] - w[n-1] u[n]$$

$$w[n] = w[n-1] + K^T e$$

$$P[n] = \lambda^{-1} P[n-1] - \lambda^{-1} K u^T[n] P[n-1]$$

where d[n] is the current value of the laser parameter error signal, w[n] is the estimate of the sensitivity of the error signal with respect to the other laser operating parameter, u[n] and P[n] together form an estimate of the inverse variance of the other laser operating parameter, $\lambda$, is a forgetting factor from 0.0 to 1.0 and n, is a sample index. According to aspects of an embodiment of the disclosed subject matter a line narrowed high average power high pulse repetition laser micro-photolithography light source fluorine injection control method and apparatus may comprise a laser operating parameter measurement mechanism measuring a laser operating parameter of the light source; a laser operating parameter tracking mechanism providing a representation of the value of the laser operating parameter over time; a laser system gas refill prediction mechanism predicting the time for a gas fill based upon the trending of the value of the laser operating parameter between a first relatively constant steady state trend value and a limiting value. The laser operating parameter may be selected from the group comprising voltage (V) and differential firing time (dtMOPA).

DETAILED DESCRIPTION OF THE DISCLOSED SUBJECT MATTER

State of the art on board metrology, used to accurately measure E95 bandwidth, as discussed in one or more of the above referenced co-pending U.S. patent applications, has enabled a new array of active control solutions to be deployed.

Advanced spectral engineering techniques, including sophisticated control algorithms, according to aspects of an embodiment of the disclosed subject matter are disclosed to be able to be used to stabilize and regulate the bandwidth of the lithography light source while maintaining other key performance specifications.

According to aspects of an embodiment of the disclosed subject matter several algorithms that have been considered, e.g., an E95 feedback algorithm, a laser power feed forward algorithm, a dither control algorithm and a BCD curve trace algorithm. Applicants propose, e.g., to use a measured E95 signal to determine an adjustment to the BCD position, with aim to stay on a particular side of a BCD operating curve, e.g., the right hand side of the BCD curve, as illustrated by way of example in FIG. 1. As an example, an algorithm may, e.g., be used in combination with dither to determine slope, and from the slope the algorithm can determine, e.g., which side of an extremum, e.g. a minimum the laser system is operating. If on the negative slope side the algorithm may be set to always move to the right on the operating curve, e.g., to try to move to and then stay on the positive slope side. In an E95 feed forward algorithm, e.g., a measured effective power of the laser may be determined, e.g., by using the number of laser system electric gas discharges, e.g., in a single chamber gas discharge laser system ("shots fired") in some time interval and the average energy of the output laser light pulses of the laser, to adjust the BCD in a feed forward manner, e.g., using previously identified calibration constants, such as is discussed in the above referenced co-pending patent application Ser. No. 11/254,282, entitled METHOD AND APPARATUS FOR GAS DISCHARGE LASER BANDWIDTH AND CENTER WAVELENGTH CONTROL, filed on Oct. 20, 2005, Published on Jun. 6, 2006, Pub. No. US20060114958. The E95 Dither algorithm may be utilized, e.g., to apply positive and negative perturbation steps to the current BCD position and measure bandwidth, e.g., E95 to determine which slope the laser is currently operating on and then to move in the appropriate direction, e.g., to minimize slope and/or change the slope sign or change the slope to another selected slope.

Figure 2:
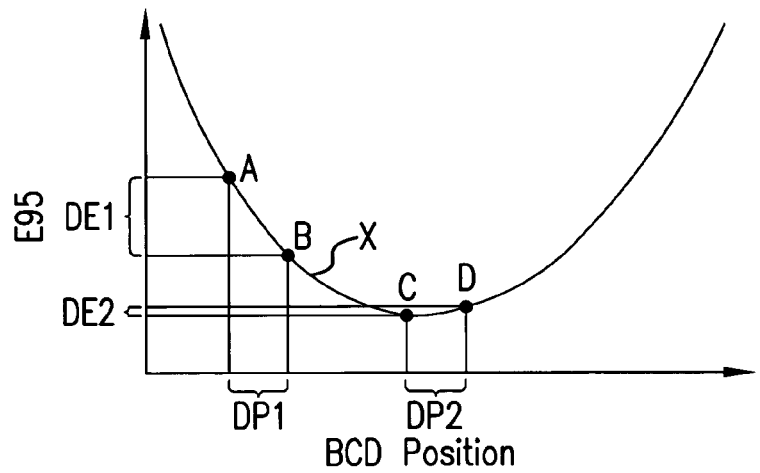
FIG. 2 shows as model of laser system operation on an idealized bandwidth control device curve, according to aspects of an embodiment of the disclosed subject matter.

An optimization according to aspects of an embodiment of the disclosed subject matter can involve, e.g., moving a delta in BCD position and measuring the E95 change. This change may then be used, e.g., to determine the BCD curve slope. If the slope is, e.g., above some threshold then the BCD position can be moved so as to minimize the slope, i.e., to drive the slope to zero, e.g., as illustrated by way of example in FIG. 2. As an example, starting at point A, the algorithm may, e.g., measure E95 and then move to point B, e.g., by changing the curvature of the grating using the BCD and X turns clockwise or counter clockwise, and again measure E95, e.g., using some filtering, e.g., via a settling time, e.g., to allow for the settling out after step changes, e.g., to the BCD position and allowing the BCD itself to relax from the stress of the bending position change, and E95 averaging, e.g., over n samples in time. The slope calculated: DE1/DP1 can then, e.g., be used such that the BCD position is again increased, e.g., moving to point C where the just noted operation may then be repeated, e.g., to continue tracking the minimum of the BCD curve, which may move, e.g., with time and/or duty cycle or the like changes.

Figure 3:
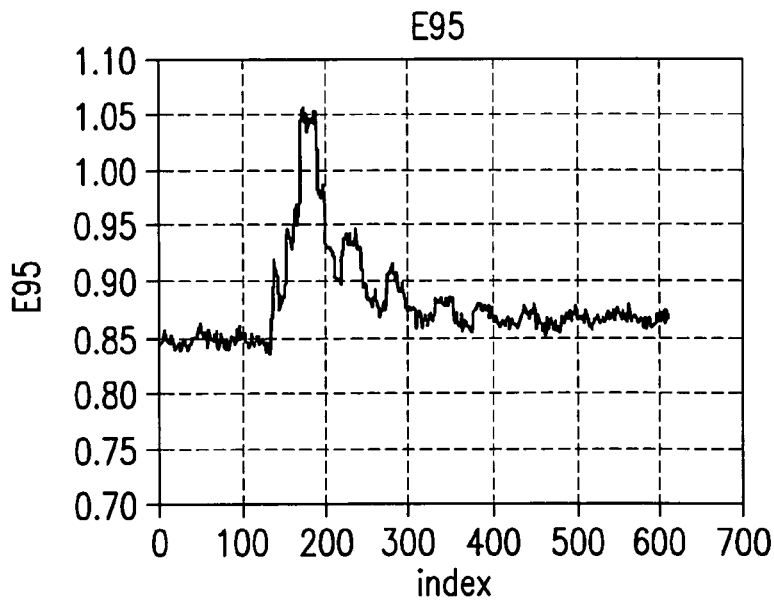
FIG. 3 shows an illustrative $E_{95}$ response plot as the BCD position is varied, e.g., with time, according to aspects of an embodiment of the disclosed subject matter.
Figure 4:
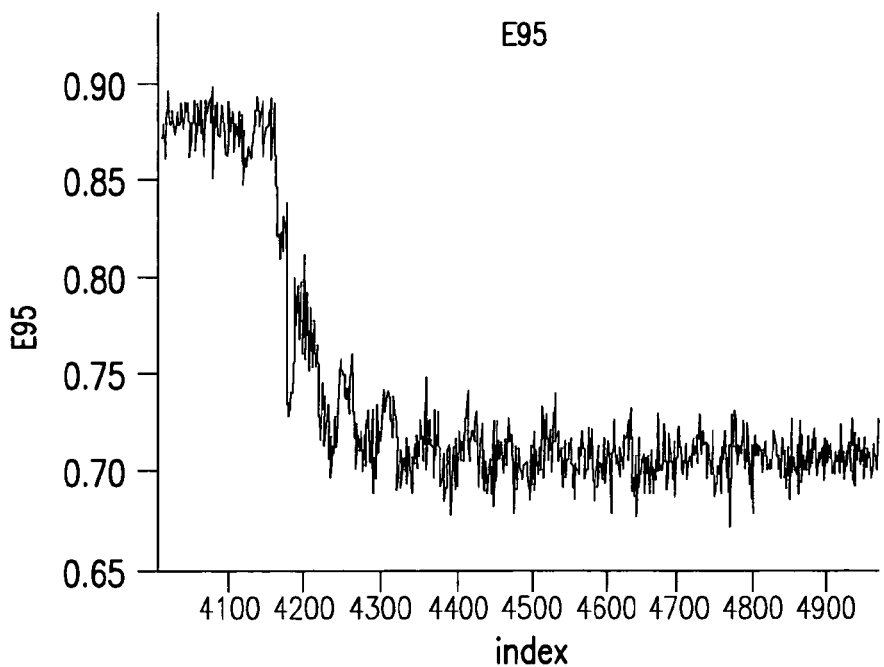
FIG. 4 shows an illustrative $E_{95}$ response plot for a change of $E_{95}$ setpoint using, e.g., the BCD as a control actuator, according to aspects of an embodiment of the disclosed subject matter.
Figure 5:
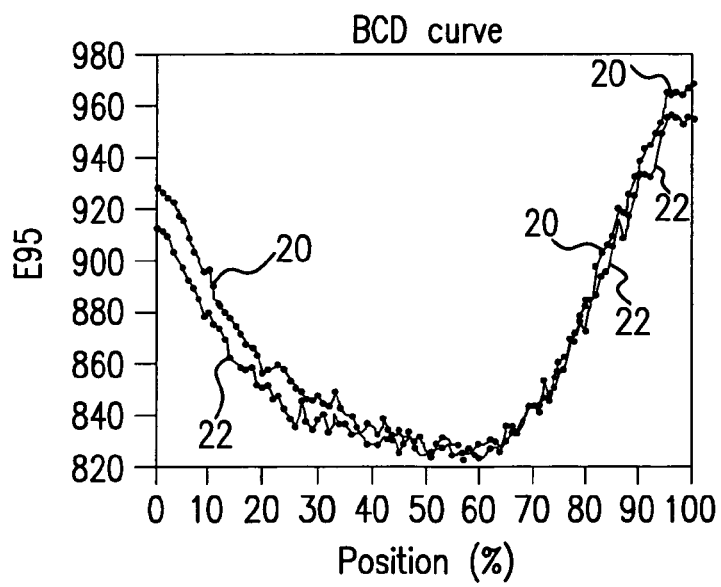
FIG. 5 illustrates by way of example laser system operation curves for BCD positions (e.g., forwards and backwards trajectories), according to aspects of an embodiment of the disclosed subject matter.
Figure 6:
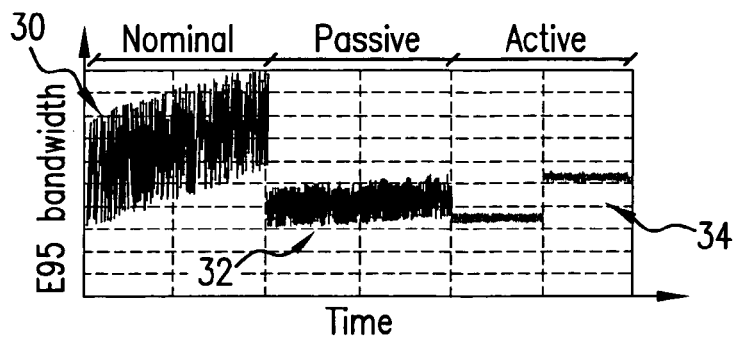
FIG. 6 illustrates by way of example bandwidth variations with no bandwidth control, with passive control and the active control in addition, according to aspects of an embodiment of the disclosed subject matter.

Again by way of example, as illustrated in FIG. 3 the plot shows an example whereby bandwidth was stabilized at about 0.85 pm, e.g., ± about 1.5 fm and then the BCD adjusted, e.g., manually or actively, e.g., about 6 turns CW while dither was enabled. The return to minimum BCD position is evident, e.g., in the gradual decrease of the BCD curve back to the minimum. The x-axis is in 0.1 sec increments for a total of 70 seconds. In another example for a step change to BCD position, the algorithm may, e.g., dither the BCD back to its minimum, e.g., at a lower duty cycle, e.g., as illustrated in FIG. 4 by way of example. With a BCD Trace, the algorithm may automatically trace the BCD curve, e.g., E95 versus BCD position with averaging, as illustrated by way of example in FIG. 5, which illustrates how, e.g., $E_{95}$ varies with BCD position at a particular duty cycle, which can be useful in optimizing the BCD position, e.g., for a particular operating mode(s).

Stabilizing $E_{95}$ bandwidth has been a focus of DUV laser design for some time now, and considerable effort has been invested in passive improvements to bandwidth stability, i.e., not employing active control methods such as sensing a measured signal and performing feedback or feed forward actuation. Some of the passive improvements to DUV laser technology have involved, e.g., baseline system modifications that dampen acoustic disturbances in the discharge region and those that reduce the system sensitivity to optical power loading. According to aspects of an embodiment of the disclosed subject matter, applicants propose to introduce the ability to regulate the $E_{95}$ to a desired setpoint on the fly. This $E_{95}$ setpoint may be chosen so as to minimize OPE or to provide tool-to-tool matching or other beneficial consequences for micro-photolithography. State of the art on board metrology, used to accurately measure $E_{95}$ bandwidth, has enabled a new array of active control solutions to be developed to stabilize and regulate the bandwidth of the light source while maintaining other key performance specifications. According to aspects of an embodiment of the disclosed subject matter, applicants propose developments in active stabilization of bandwidth that can be utilized, e.g., on the above noted types of line narrowed DUV laser systems, e.g., as micro-photolithography light sources, and also including other high average power, high pulse repetition rate line narrowed laser light sources, e.g., XeCl, XeF, ArF, KrF and $F_2$ laser light sources.

In performing active spectral control ("ASC") applicants, according to aspects of an embodiment of the disclosed subject matter propose to, e.g., utilize the statistical accuracy of the measured $E_{95}$ (that is actually being sensed by an E95 monitor, recognizing that given the tolerances for error of the measuring instrument and its own slit function interference with what is being attempted to be measured results in not being quite able to measure the actual E95) and also on the method of effecting change to $E_{95}$ (actuation).

Figure 7:
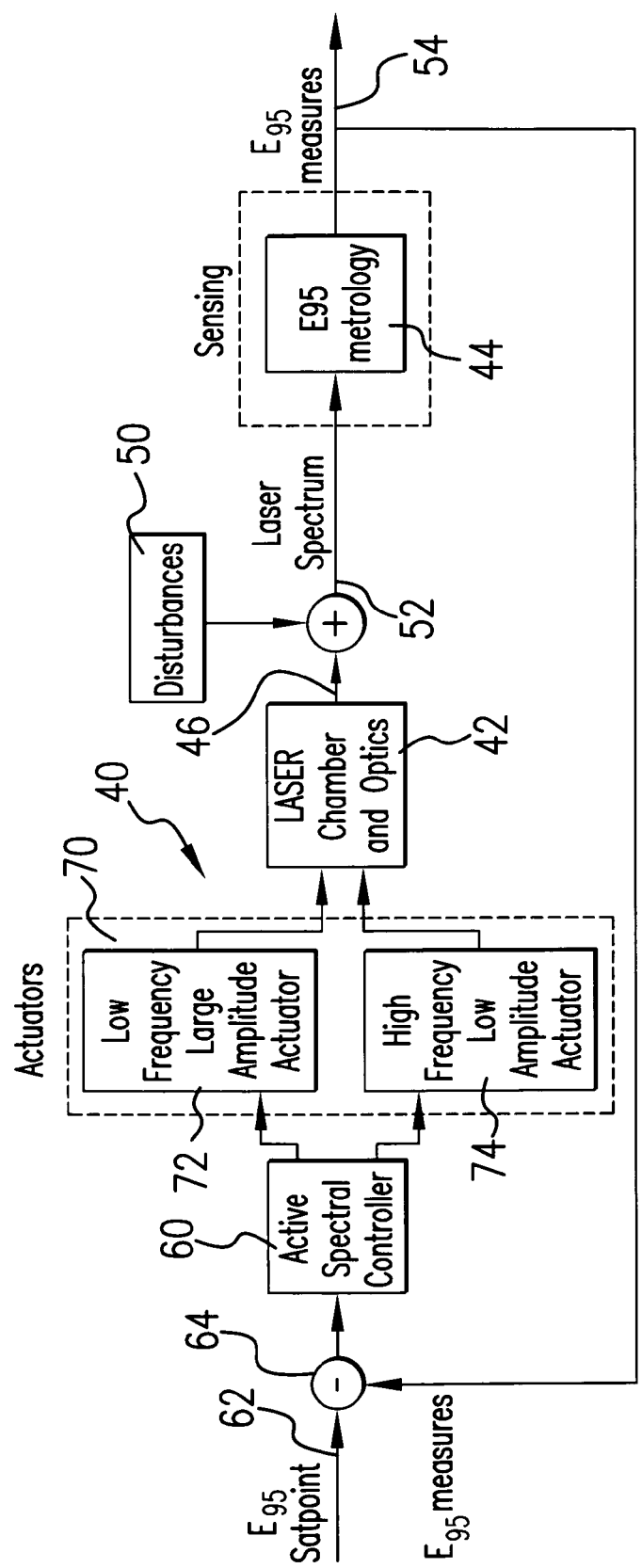
FIG. 7 illustrates schematically and in block diagram form an active bandwidth control circuit according to aspects of an embodiment of the disclosed subject matter.

Turning now to FIG. 7 there is illustrated schematically and in block diagram form an active bandwidth control system 40 according to aspects of an embodiment of the disclosed subject matter wherein, e.g., a laser chamber and optics (depicted in the block 42) producing a nominal output 46 which may, e.g., be subjected to disturbances 50 and as such, therefore, produces an actual laser light source output laser light pulse beam 52, e.g., having a spectrum that is the input to an $E_{95}$ metrology module 44, which in turn may produce an output 54 indicative of the measured bandwidth, e.g., E95. The output 54 of the sensor in the metrology module 44 may be, e.g., the measured $E_{95}$ bandwidth. Recent advances in onboard etalon spectrometer technology, as discussed in one or more of the above referenced co-pending patent applications, and also discussed in Rafac, "Overcoming limitations of etalon spectrometers used for spectral metrology of DUV excimer light sources", *Optical Microlithography XVII*, Bruce W. Smith, Editor, Proceedings of SPIE, Volume 5377 (2004) pp. 846-858 have enabled calculation of $E_{95}$ bandwidth, e.g., with a precision comparable to that of a state-of-the-art high-resolution Echelle grating spectrometer.

Along with being, e.g., a displayed laser diagnostic value which can be used for external process monitoring, this measurement 54 is fed back to the ASC controller 60 after being compared to a desired $E_{95}$ bandwidth setpoint 62 in a summer 64. The ASC controller 60 may then, e.g., use this bandwidth error signal 66, e.g., in combination with information from other laser signals, e.g., relating to target energy and duty cycle compensations, to calculate input signals to an actuator unit 70 which may comprise, e.g., two actuators, a low frequency large amplitude actuator 72 and a high frequency small amplitude actuator 74. The actuators 72, 74 may then, e.g., induce a corrective action to the laser behavior in order to move the measured $E_{95}$ towards the $E_{95}$ setpoint, thereby closing the feedback loop.

A high average power high pulse repetition rate line narrowed laser light source, e.g., for micro-photolithography, e.g., a DUV laser system, single or multi-chamber, is a Multiple-Input Multiple Output (MIMO), time varying, nonlinear system and the choice of actuator methods, according to aspects of an embodiment of the disclosed subject matter, may be chosen carefully as each can and often does cause other effects to the laser performance than just the desired reduction in bandwidth error. These effects could be desirable or they could be in opposition to certain laser performance specifications. According to aspects of an embodiment of the disclosed subject matter, applicants propose certain multistage, e.g., dual stage actuator designs, which have been found to demonstrate superior ability to attenuate the wide array of disturbances that may be imposed on the laser system 42. FIG. 7 illustrates, by way of example, a dual stage actuator system, e.g., being driven by different control signals, and, e.g., affecting the laser system 40 behavior through separate inputs. These actuators may be selected and designed to work together, e.g., to work in tandem, but also may each be optimized, e.g., to respond to a particular class of disturbance(s). Together according to aspects of an embodiment of the disclosed subject matter such coordination and cooperation may be employed to, e.g., hold the bandwidth, e.g., the $E_{95}$ bandwidth, at a desired setpoint or at least within a desired ± range around a setpoint, even though the laser may be being subjected to a wide array disturbances.

Some laser system disturbances may also be minimized or at least lessened by improving other onboard control systems; for example, minimizing chamber thermal and pressure variations. However, other disturbances, such as changes in laser output energy and duty cycle, are characteristic of how the laser is operated, and thus less susceptible to minimization. Other long-term disturbance factors, such as aging of components and alignment changes can also affect $E_{95}$ bandwidth, without very effective mechanisms for directly lessening these more or less irreversible changes, i.e., component age cannot be reversed without replacement and mis-alignment drift cannot be changed without maintenance to realign optical elements.

Figure 8:
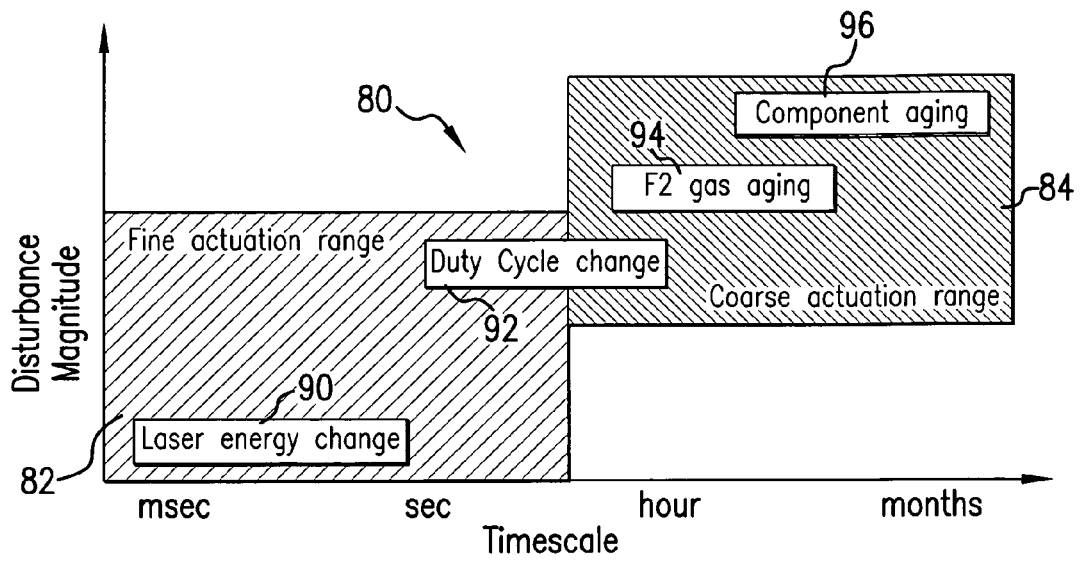
FIG. 8 illustrates disturbance types and time scales and magnitudes, according to aspects of an embodiment of the disclosed subject matter.

According to aspects of an embodiment of the disclosed subject matter applicants have noted that disturbances may be categorized, e.g., by the time scale and/or magnitude by which they affect $E_{95}$ bandwidth, as illustrated by way of example in the disturbance effect chart of FIG. 8. Setpoint changes in laser operating parameters, e.g., output pulse energy 90 can constitute, e.g., low magnitude disturbances that can, e.g., affect $E_{95}$ on a very fast timescale, typically msec to sec, i.e., in the fine actuation range 82. Other changes, e.g., changes in duty cycle 92 and gas aging 94 (e.g., fluorine gas consumption), can affect $E_{95}$ bandwidth in the timescale of, e.g., seconds (e.g., for higher frequency aspects of duty cycle setpoint changes) to hours, e.g., (lower frequency aspects of changes in duty cycle setpoint) with larger magnitude effects. Other longer-term parameter changes, e.g., due to the effects of optical component aging and the like 96 may be experienced, e.g., in the days to weeks or perhaps even longer timescales, and can also be, e.g., largest magnitude disturbances. The latter two may be in the coarse actuation range 84.

According to aspects of an embodiment of the disclosed subject matter, within a multi-stage actuator, e.g., a dual stage actuator, framework, control action may, e.g., be divided into coarse actuation and fine actuation. A coarse actuator(s) may, e.g., singly or in combination with another actuator, e.g., target large magnitude changes that occur at low frequency. In laser light sources such as those noted above this may include large $E_{95}$ setpoint changes, gas aging effects and the long timescale component of duty cycle changes (resulting, e.g., from slow thermal loading variations, increase in age of laser components and the like). A fine actuator(s) may, e.g., alone or in combination with another actuator, target smaller magnitude but higher frequency disturbances, such as laser system output pulse energy, and the fast component of duty cycle changes (resulting, e.g., from faster thermal loading transients and the like). The coarse actuator(s) can also serve, e.g., to de-saturate, or re-center, a fine actuator(s) within its control range. That is, as the fine actuator's control output can, e.g., trend towards its minimum or maximum value, and then, e.g., the coarse actuator can apply corrective action in such a way as to restore the fine actuator back towards its centered value, e.g., nominally 50% if control authority is balanced in both the positive and negative directions.

One viable choice for a coarse actuator can be $F_2$ gas injection, which can, e.g., adjust the $F_2$ concentration of the laser chamber, e.g., in ways discussed in above referenced co-pending patent applications. For dual chamber systems, one of the fine actuator choices available may be, e.g., control of the relative time delay, denoted $\Delta t_{MOPA}$, between the commutation of the Master-Oscillator ("MO") and Power-Amplifier ("PA") or Power Oscillator ("PO") pulsed-power supply (not shown). For single chamber systems, alternatives can include manipulation of the curvature of the Linewidth Narrowing Module (LNM) grating surface.

According to aspects of an embodiment of the disclosed subject matter regulating the fluorine ($F_2$) gas concentration in the laser chamber can, e.g., provide an effective means of coarse control of $E_{95}$ bandwidth. The chamber comprises a gain medium between the fully reflective Line Narrowing Module (LNM) and the partially reflective Output Coupler (OC), i.e., forming a laser resonance oscillator cavity. The LNM progressively narrows the spectrum of incident light after each round trip to the OC and back. Each round trip through the cavity increases the stimulated emission of light and therefore the light output energy. Eventually the stimulated emission depletes all of the energy stored in the gain medium of the oscillator and the laser pulse ends. Increasing the chamber $F_2$ concentration, e.g., increases the gain, speeding the build-up of energy in the cavity. The stored energy can then be depleted more rapidly because there is more stimulated emission, so the laser is above the oscillation threshold for less time. Due to the finite speed of light, this can equate to fewer round trips, which can decrease the line narrowing of the light, and thus the $E_{95}$ bandwidth can be larger. Decreasing the chamber F2 concentration can have the opposite effect, i.e., it can reduce the $E_{95}$ bandwidth.

Figure 9:
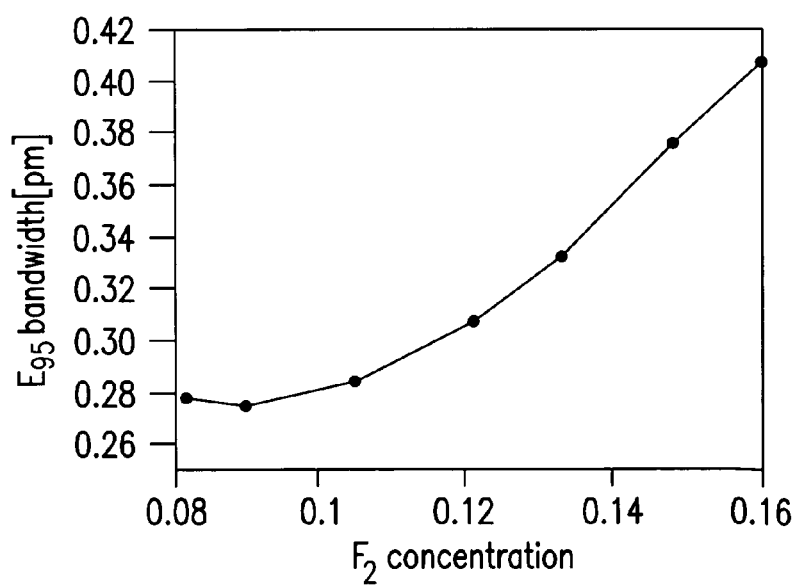
FIG. 9 illustrates an exemplary plot of changing $e_{95}$ bandwidth with change in fluorine gas content in a lasing chamber, according to aspects of an embodiment of the disclosed subject matter.

However, the effect of changing the $F_2$ concentration can be multifaceted. For example, such a change can also affect other laser performance parameters, e.g., including voltage and energy stability. As such, the regulation of $F_2$ concentration can comprise a multiple input optimal control problem. FIG. 9 illustrates by way of example how $E_{95}$ bandwidth of light exiting the laser system can vary, e.g., as $F_2$ concentration is adjusted in the MO chamber on a typical MOPA configuration, e.g., a Cymer XLA 1XX, 2XX or 3XX multi-chamber laser system platform (a "MOPA" system), which also is similar to a single chamber laser system response, e.g., from a Cymer ELS-7010 laser system platform. FIG. 9 illustrates, e.g., an $E_{95}$ bandwidth control authority using $F_2$ concentration.

According to aspects of an embodiment of the disclosed subject matter using $F_2$ concentration as a coarse actuator to control $E_{95}$ bandwidth has a number of advantages, including, e.g., (1) the addition of $F_2$ to the laser gas, or its natural depletion as the laser is operated, can affect other chamber performance parameters slowly enough (e.g., minutes or more) that other fast controllers (energy, wavelength, timing, etc.) may, e.g., be effectively decoupled and are able to track without error, e.g., under the control of a separate higher frequency control actuator; and (2) the available range of actuation is large enough to, e.g., attenuate the sources of bandwidth deviation being targeted, e.g., long term duty cycle variations, gas aging and component aging. Slow changes tend to have a larger dynamic range so the larger signal disturbances can be corrected, however, more slowly, and vice-versa for disturbances that can be targeted more quickly for those types of disturbances that require a quicker response.

Figure 10:
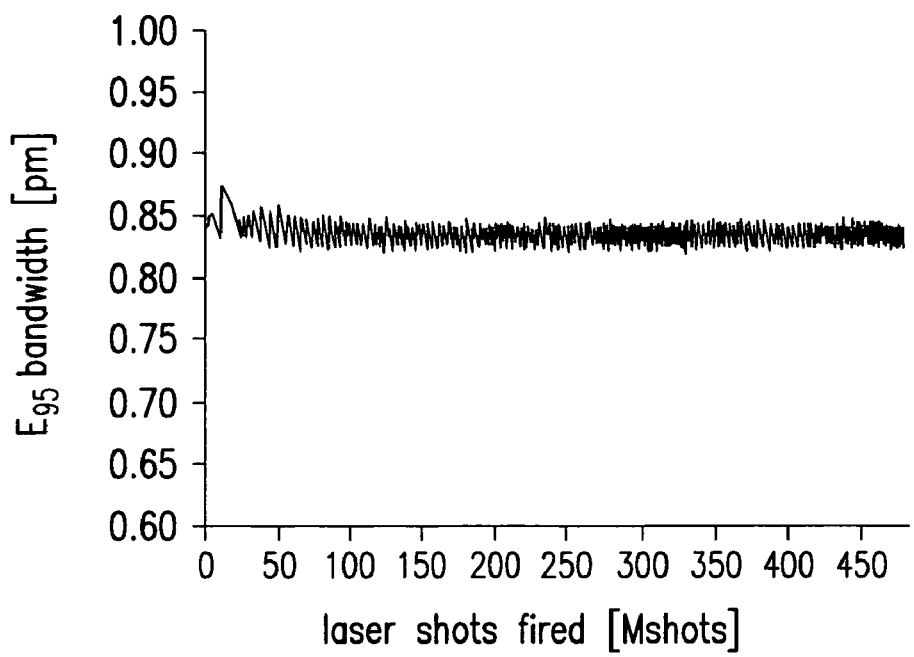
FIG. 10 illustrates an exemplary plot of bandwidth control according to aspects of an embodiment of the disclosed subject matter.
Figure 12:
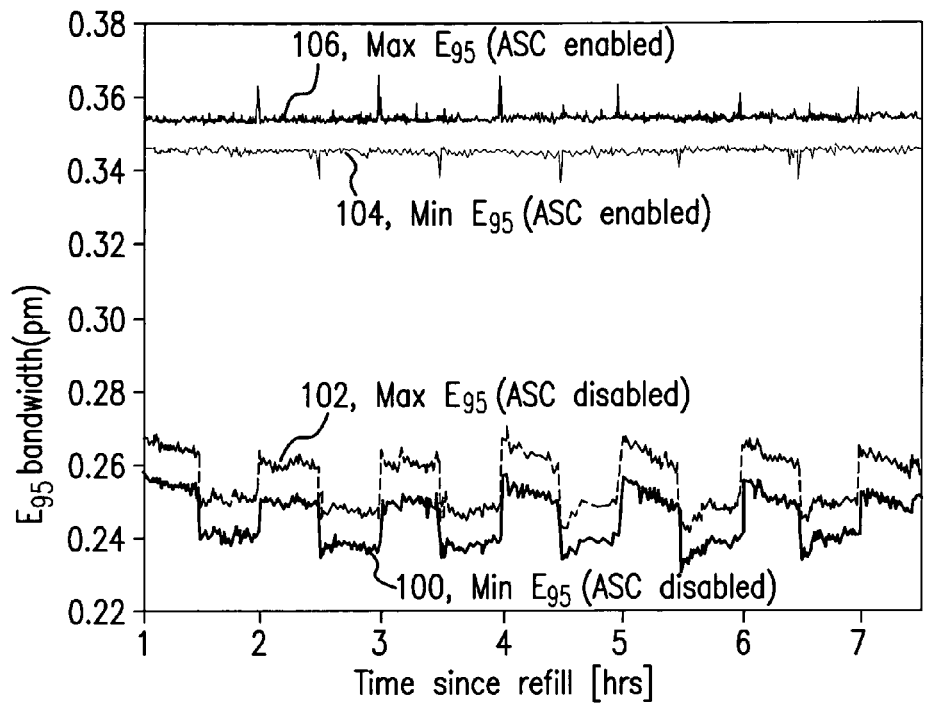
FIG. 12 illustrates an exemplary response of $E_{95}$ bandwidth with and without active bandwidth control according to aspects of an embodiment of the disclosed subject matter between gas refills, according to aspects of an embodiment of the disclosed subject matter.

FIG. 10 illustrates an effect of above noted $F_2$ injection techniques used as a coarse-actuation on $E_{95}$ bandwidth, e.g., on a single chamber Cymer ELS-7010 platform. The data displayed on the chart shows $E_{95}$ bandwidth measurements taken, e.g., every 30 seconds over a, e.g., 10 hour test, i.e., about 500 million shots. The exemplary laser was fired at 75% duty cycle and the output energy was 10 mJ. The controller 60 was able to regulate $E_{95}$ to a 0.84 pm setpoint with and a Total Included Range (TIR) of less than 50 fm for more than 450 Mshots. FIG. 12 illustrates by way of example the effect of above noted $F_2$ injection techniques used as a coarse-actuation on E95 bandwidth, e.g., on a dual-chamber Cymer XLA 200 platform, e.g., as discussed in Toshihiko Ishihara, Rafac, et al., "XLA-200: the third-generation ArF MOPA light source for immersion lithography", *Optical Microlithography XVIII*, Bruce W. Smith, Editor, Proceedings of SPIE, Volume 5754 (2005) pp. 773-779. The data displayed on the chart shows $E_{95}$ bandwidth measurements taken every, e.g., 30 seconds over, e.g., a 10 hour test, i.e., about 110 million shots. The exemplary laser was fired at 75% duty cycle and the output energy was 10 mJ. The controller 60 was able to regulate $E_{95}$ to about a 0.275 pm setpoint with and a Total Included Range (TIR) of less than 15 fm. Both of these experiments illustrate the extremely tight control achievable with $F_2$ injections.

Figure 11:
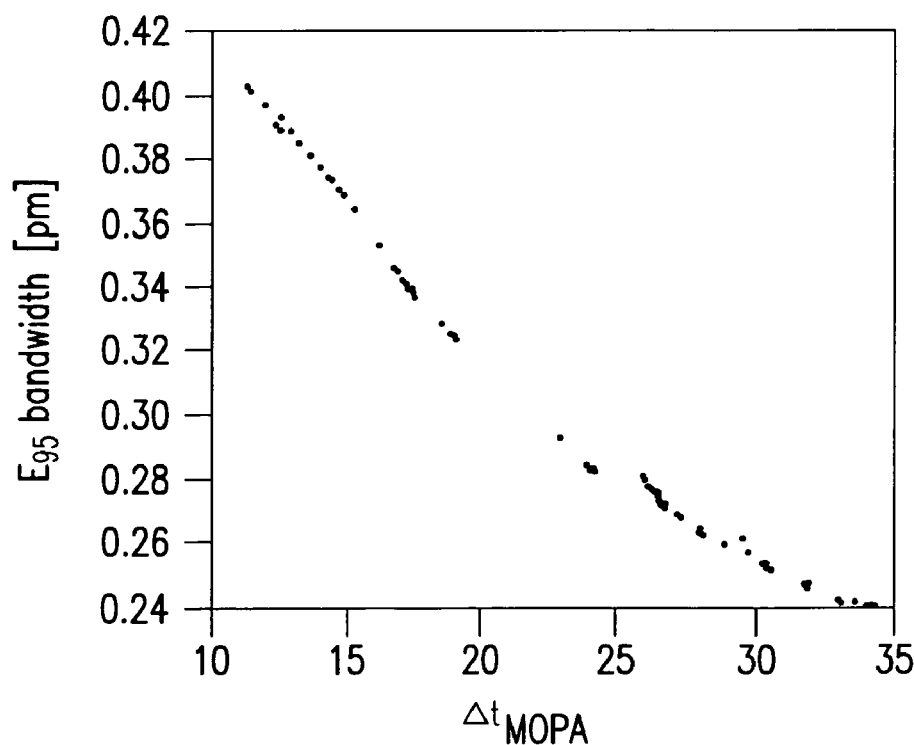
FIG. 11 illustrates an exemplary plot of the change of $E_{95}$ bandwidth with change in differential firing time between two chambers in a seed oscillator/amplifier gain medium laser system, according to aspects of an embodiment of the disclosed subject matter.

In dual chamber lasers, e.g., in a MOPA configuration, E95 bandwidth may be seen to be sensitive to the relative time delay, denoted $\Delta$tMOPA, between the commutation of the MO and PA pulse power. The MO pulse becomes more line-narrowed over its duration as explained above. The effect of this can be seen to be that as the PA chamber is fired later relative to the MO chamber, it selects a more line-narrowed portion of the MO pulse and the effective E95 bandwidth of the laser decreases. FIG. 11 shows how E95 bandwidth can vary as differential firing time is adjusted, e.g., on a typical MOPA configuration dual chamber laser system. FIG. 11 illustrates, e.g., an $E_{95}$ bandwidth control authority using $\Delta t_{MOPA}$. The use of differential firing time as a fine actuator to control $E_{95}$ bandwidth has a number of advantages, e.g., (1) the measurement of $E_{95}$ and the change of $\Delta t_{MOPA}$ both can occur, e.g., on about a tens-of-pulses time scale, or shorter, e.g., pulse-to-pulse, e.g., allowing for very high frequency disturbance rejection. That is, disturbances can be suppressed very quickly; and (2) the available range of actuation can be seen to be large enough to, e.g., attenuate/suppress the sources of bandwidth deviation being targeted, namely laser energy and the higher frequency effects of duty cycle variations. FIG. 12 illustrates the effect of the $\Delta t_{MOPA}$ fine-actuator and F2 inject coarse-actuator, e.g., in a dual stage controller 60. The displayed data on the chart shows, e.g., maximum and minimum $E_{95}$ bandwidth measurements taken every 30 seconds during a seven hour test, e.g., $E_{95}$ min curve 100 without dual stage control and a max $E_{95}$ curve 102 without dual stage control, and a min $e_{95}$ curve with dual stage control 104 and a similar max $E_{95}$ curve 106. The laser was fired at 75% duty cycle and the output energy of nominally 10 mJ, i.e., switched between 9 mJ and 11 mJ every half hour Indicated by the spikes in curves 104 and 106 and the step changes in curves 100 and 102. The lower set of curves 102, 104 illustrate the kind of behavior when, e.g., only one actuator, e.g., one coarse actuator, e.g., $F_2$ inject control), is applied and the upper curves 104, 106, illustrate the effect when, e.g., a fine actuator, e.g., differential commutation control, is also used, e.g., to stabilize $E_{95}$ bandwidth, along with the $F_2$ injection control and to also shift it up to a setpoint value of 0.35 pm. The data illustrates a dramatic improvement, whereby, e.g., timing control has stabilized E95 bandwidth to well within the limits of the $E_{95}$ metrology.

Figure 1:
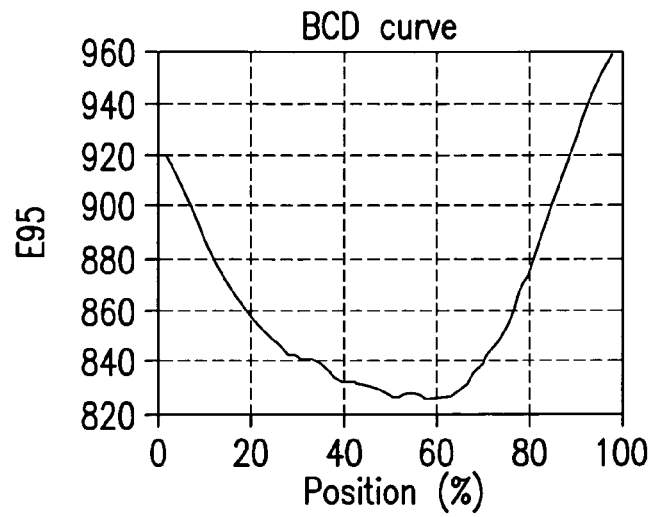
FIG. 1 shows a bandwidth control device $E_{95}$ sensitivity curve.

Modifying the optical wavefront and/or modifying the interaction between the wavefront and, e.g., the line narrowing module grating, within the laser's line narrowing module, e.g., by changing the shape of the grating surface (or otherwise modifying the wavefront shape incident on the grating face elsewhere in the optical train, can also be an affective optical method of regulating $E_{95}$ bandwidth, e.g., with fine resolution on a relatively fast time scale, e.g., on the order of seconds. FIG. 1 illustrates the relationship between $E_{95}$ and a normalized grating curvature, which can be seen to be roughly quadratic in nature. Using grating curvature as a fine actuator to control $E_{95}$ bandwidth can have several advantages, e.g., (1) the grating curvature can be changed quickly, thereby allowing fast optical wavefront curvature correction to reduce disturbances and facilitate changes in $E_{95}$ bandwidth setpoint, and (2) the available range of actuation is large enough to attenuate/suppress targeted sources of bandwidth deviation, such as duty cycle variations. FIG. 4 illustrates, e.g., $E_{95}$ setpoint regulation on a Cymer ELS-7010 platform, demonstrating a transition between two E95 bandwidth setpoints. e.g., around 0.875 pm and about 0.710 pm, e.g., using grating wavefront curvature change.

As OPE requirements tighten in the future it is expected that bandwidth control techniques effective to control $E_{95}$ bandwidth will be required, necessitating more active control methods to supplement the current passive schemes. As a result, according to aspects of an embodiment of the disclosed subject matter applicants have developed an array of coarse and fine actuators and dual stage control techniques to meet this need. Complementing these control methodologies with the latest in $E_{95}$ bandwidth metrology according to aspects of an embodiment of the disclosed subject matter has allowed high performance $E_{95}$ stabilization and regulation even while under the influence of various operating disturbances. Examples of feasible dual stage actuator designs include, e.g., pairing of an F2 injection controller as the coarse actuator, and either a $\Delta t_{MOPA}$ controller or line narrowing module grating curvature controller, as the fine actuator. Applicants have demonstrated that these methods may be suitable for integration into, e.g., DUV laser light source products in order to, e.g., create tight $E_{95}$ stability bounds and wide $E_{95}$ setpoint regulation required by industry.

$F_2$ injection control may be done, e.g., according to one or more algorithms, such as JAFFA or AFI described in one or more of the above referenced co-pending patent applications and BCD control may be done, e.g., with active BCD deformation based on BW error feedback, e.g., with a pneumatic BCD bending mechanism, the details of which are discussed in one or more of the above referenced co-pending patent applications and dt MOPA may be selected and modified, e.g., using a timing and energy control module, such as is sold on applicant's assignee's existing XLA XXX model laser systems, e.g., to control dtMOPA based on bandwidth error feedback, and also described in one or more of the patents or co-pending applications noted above.

Figure 13:
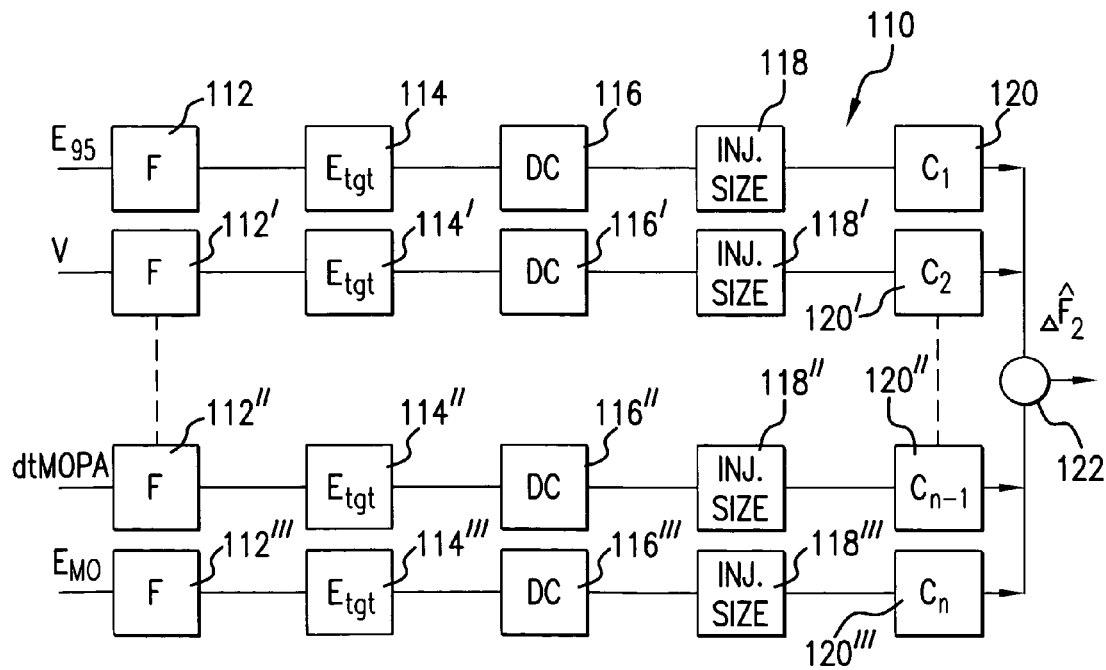
FIG. 13 illustrates a control system error signal modification circuit for normalizing one laser parameter error signal to the effects of another laser parameter changing, according to aspects of an embodiment of the disclosed subject matter.

As is discussed in one or more of the above referenced co-pending patent applications a bandwidth control system, e.g., an $F_2$ injection control system may be desensitized to the impact of other laser operating parameters on the measured error signal for a feedback control parameter, e.g., by desensitizing measurements of the parameter, e.g., bandwidth measured in $E_{93}$, bandwidth measured in FWHM, dtMOPA, energy output of the MO ("$E_{mo}$"), Voltage, MO operating point and the like to changes in other parameters, e.g., energy target ("E") and duty cycle ("DC"). FIG. 13 illustrates schematically and in block diagram form such a system. FIG. 13 shows, e.g., bandwidth, e.g., measured as $E_{95}$, voltage, MOPA timing ("dtMOPA") and energy out of the MO ("$E_{MO}$") (e.g., $E_{95}$) being so called "normalized" and applied to determine, e.g., an amount of $F_2$ that has been consumed in the laser system chamber (or in one of two or more respective laser system chambers) based also on "trust" coefficients that reflect, e.g., the confidence in the measured quantity (e.g., due to signal to noise ratio in the measurement(s)) and/or the stability/predictability of the respective empirically determined relationship of, e.g., the change in $F_2$ concentration (i.e., the amount of $F_2$ consumed) for a given change in the respective laser system operating parameter.

The respective laser system operating parameter, e.g., $E_{95}$, V, dtMOPa and $E_{MO}$ measured error signal (variance from a selected setpoint) may, as illustrated in FIG. 13 by way of example be filtered in some fashion, e.g., a low pass filter [e.g., by averaging over a selected number of measurements, measurements for $E_{95}$ in a respective filter, 112, 112', 112" and 112'". The respective filtered error signals may then be adjusted for the current Energy target, e.g., the energy measured at the laser system overall output, e.g., at the shutter. The filtered parameter, e.g., $E_{95}$ may then be modified according to energy Target $E_{tgt}$, e.g., by having subtracted from it a value based upon the current energy target, e.g., 10 mJ, e.g., based on a relationship empirically determined, e.g., $\delta \hat{F}_2/\delta E_{tgt}$, between the change in estimated fluorine consumption $\delta \hat{F}_2$ and the change in energy target $\delta E_{tgt}$ in the respective $E_{tgt}$ correction boxes 114, 114', 114" and 114'" for the respective parameters $E_{95}$, V, dtMOPa and $E_{MO}$ or other like values, e.g., dV/dE, DE95/dE, dFWHM/dE, etc. Subsequently in the respective DC correction boxes, 116. 116', 116" and 116'", the laser operating parameter, e.g., $E_{95}$ error may be normalized for, e.g., duty cycle, e.g., having the value $\delta \hat{F}_2/\delta DC$ subtracted from it to scale the change in duty cycle by the sensitivity of, e.g., $E_{95}$ to duty cycle, or other like values, e.g., dV/dE, DE95/dE, dFWHM/dE, etc.

Estimates for the sensitivities of, e.g., $E_{95}$, V, dtMOPA or $E_{MO}$ to, e.g., influencing variable laser performance parameters, e.g., duty cycle and shutter energy may be estimated by, e.g., running a calibration test which varies energy or duty cycle and measures the changes in, e.g., $E_{95}$ V, dtMOPA or $E_{MO}$.

Thereafter in the respective blocks 118, 118', 118" and 118'" the respective estimated fluorine consumption $\delta \hat{F}_2$ may be calculated for the given normalized error signal, e.g., according to the equation $(E_{95REF} - E_{95N}) \times (dF_2/dE_{95})$, where $(E_{95REF} - E_{95N})$ is the output of the combination of, e.g., the two respective parameter correction boxes 114, 116 and $(dF_2/dE_{95})$ is an empirically determined sensitivity of $\hat{F}_2$, the estimated fluorine consumption for a given laser system operating parameter change, such as $dE_{95}$. The respective estimated injection amounts to compensate for the collective changes in the operating parameters, e.g., as illustrated by way of example in FIG. 13, $E_{95}$. V, dtMOPA and $E_{MO}$ may be multiplied by a respective trust coefficient, e.g., $C_1, C_2, \ldots C_{n-1}$, $C_n$ in the respective boxes 120, 120', 120" and 120'" to obtain respective $\hat{F}_2$ for each of the n laser system operating parameter errors, which may be summed in a summer 122 to obtain a final estimate of fluorine consumption, which may then, e.g., be used by the $F_2$ injection control algorithm, as and when determined by the control algorithm as the injection amount or to determine the injection amount for example, the $F_2$ injection control algorithm may compare the current value of $\hat{F}_{2TOT}$ to an inject$_{min}$ and, e.g., hold off on injecting if the current estimate of the total fluorine consumption since the last inject, $\hat{F}_{2TOT}$, is less than inject$_{min}$.

Figure 14:
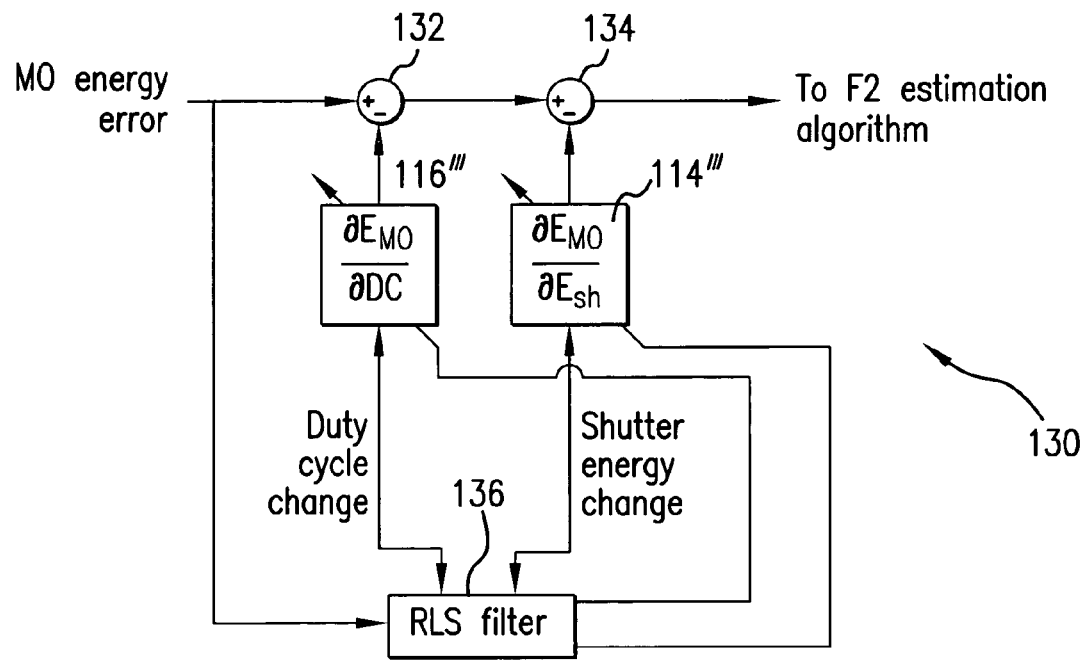
FIG. 14 illustrates schematically and in block diagram form a circuit for normalizing laser system parameter error signals in real time according to aspects of an embodiment of the disclosed subject matter.

According to aspects of an embodiment of the disclosed subject matter illustrated in FIG. 14 schematically and in block diagram format, a modified and improved algorithm 130 for determining an estimate of the fluorine consumption normalized for, e.g., $E_{tgt}$ and/or DC or the like. A recursive least squares (RLS) filter may be used after the LPF 112, e.g., to automatically identify box 114 and 116, e.g., to estimate the duty cycle and shutter energy sensitivities in real time. The RLS filter may, e.g., implement the following algorithm $$K \equiv \frac{\lambda^{-1} P[n-1] u[n]}{1 + \lambda^{-1} u^T[n] P[n-1] u[n]}$$

$$e \equiv d[n] - w[n-1] u[n]$$

$$w[n] = w[n-1] + K^T e$$

$$P[n] = \lambda^{-1} P[n-1] - \lambda^{-1} K u^T[n] P[n-1]$$

Where d[n] is the current value of the error measurement, e.g., as shown in FIG. 14 the MO energy error, w[n] is the estimate of the sensitivities of the measurement with respect to the input data in the vector, u[n] and P[n] together form an estimate of the inverse covariance of the parameter estimates in the input data vector. The value, $\lambda$, is a forgetting factor, such that, e.g., setting $\lambda$ to unity gives equal weight to all data, while setting it to a lesser value applies lesser weight to older data. The term, n, is a sample index. The vector of input data (e.g., voltage data) can, e.g., include the data to which one wishes to desensitize the respective error measurement (e.g., duty cycle data) and (possibly) other data (e.g., energy data) to improve the performance of the algorithm 130. The values of K, e, w[n] and P[n] may be utilized to modify the error signal, e.g., $E_{MO}$ by use of such values to, e.g., modify the signal based on, e.g., DC or energy targets. The outputs of which may be, e.g., negatively summed in summers 132 and 134 prior to applying the injection estimate size calculation, e.g., in the respective boxes 118, 118'", 118" and 118'". In practice, the data vector includes the duty cycle change 116''', shutter energy change 114''' and an offset, e.g., as follows:

$$u[n] = \lfloor DC_{change}[n] E_{change}[n] 1 \rfloor$$

Figure 15:
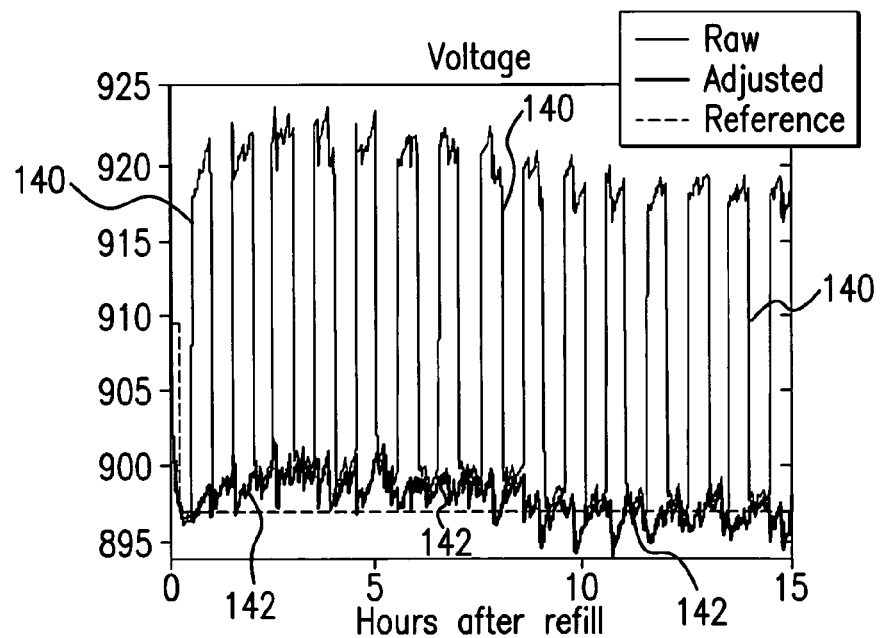
FIG. 15 illustrates an exemplary plot of the normalization of raw data according to aspects of an embodiment of the disclosed subject matter, according to aspects of an embodiment of the disclosed subject matter.

Applicants have demonstrated that this algorithm can work very well in practice. FIG. 15 shows the application of this algorithm, e.g., to voltage during a test where, e.g., energy target was varied every half hour, e.g., after a gas refill. The curve 140 is the raw voltage measurement data and the curve 142 is the adjusted voltage measurement. According to aspects of an embodiment of the disclosed subject matter and as shown in FIG. 15 such an RLS measurement correction algorithm, on the very first energy target change, and thereafter, the algorithm 130 employing the RLS filter 136 correctly identifies and compensates out the effect of the change in an influencing laser operation parameter, e.g., changes in energy target as it influences the change in measured voltage. According to aspects of an embodiment of the disclosed subject matter the algorithm may be utilized to, e.g., remove the effects of laser operating parameters unrelated to gas consumption estimates, e.g., other than gas consumption and inject effects from the respective adjusted error signal related to, e.g., $E_{95}$, V, dtMOPA or $E_{MO}$.

According to aspects of an embodiment of the disclosed subject matter applicants propose methods and apparatus for the advance prediction of the extent of an end of gas life end, which may conveniently be defined, e.g., for the purposes of this application as the point in the laser operation where there is, e.g., no longer enough control authority on voltage with, e.g., fluorine content to ensure an output parameter that is desired to be kept stable, e.g., output energy setpoint, can be maintained, e.g., where another parameter may go out of spec, e.g., the voltage rising to the upper rail, upon which also, e.g., the output energy may drop below the setpoint and the laser may then shut down.

According to aspects of an embodiment of the disclosed subject matter the laser may be enabled to operate for a variable gas life length, which under certain conditions may be much larger than the current specified gas life time, which, by way of example may simply be a more or less empirically determined value set, e.g., at fixed time since laser refill or a fixed shot count or the like. According to aspects of an embodiment of the disclosed subject matter an event time to perform a refill may, e.g., be predicted using logic applied to an analysis of certain gas control algorithm internal state variables, such as $dE95/dF_2$, $d(\Delta tMOPA)/dF_2$, $ddV/dE$, $dE95/dE$, $dFWHM/dE$, etc. $dV/dF_2$, etc.

Such an apparatus and method may employ, e.g., looking at the estimator sensitivities of, e.g., an $F_2$ injection algorithm, e.g.

Figure 16:
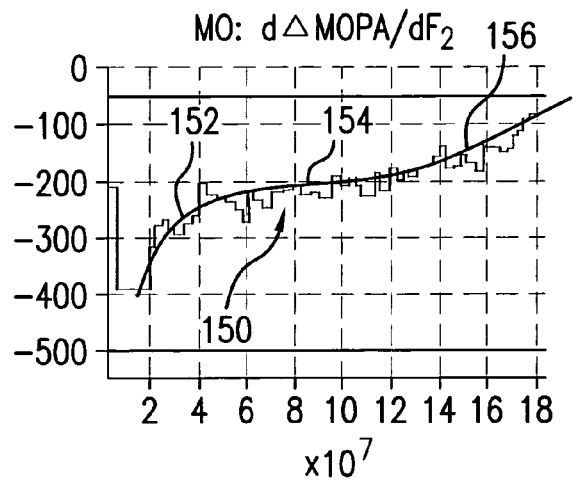
FIG. 16 illustrates an exemplary trend curve for the change in dΔtMOPA/$dF_2$ over time, according to aspects of an embodiment of the disclosed subject matter.
Figure 17:
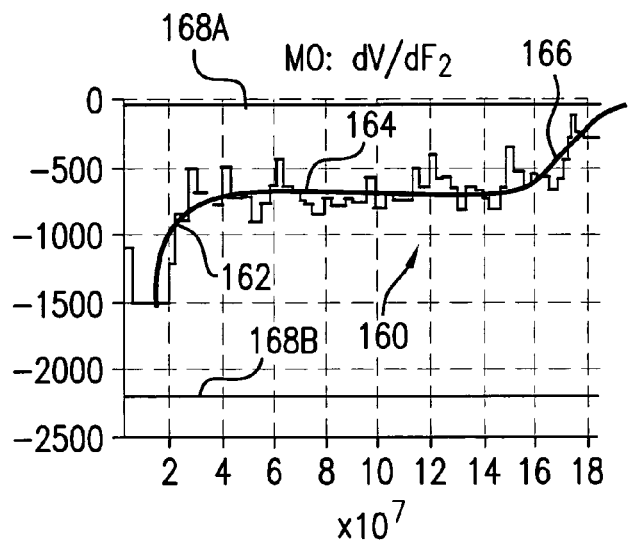
FIG. 17 illustrates an exemplary trend curve for the change in $dV/dF_2$ over time, according to aspects of an embodiment of the disclosed subject matter; and, FIG. 18 illustrates an exemplary trend curve for the change in $dE_{MO}/dF_2$ over time, according to aspects of an embodiment of the disclosed subject matter.
Figure 18:
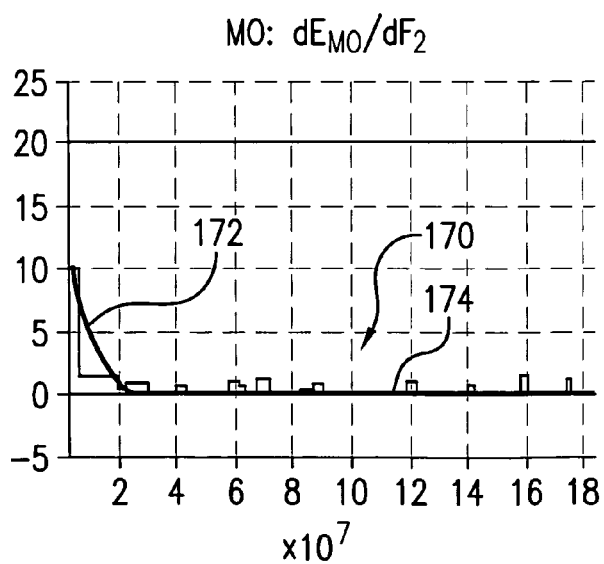

$dE95/dF_2$, $d(\Delta t_{MOPA})/dF_2$, $dV/dF_2$, $dFWHM/dF_2$, $dEmo/dF_2$, etc., and, evaluating, e.g., the rate at which they are trending toward a particular value, e.g., an extremum, e.g., a minimum value or their proximity to the minimum value. FIGS. 16-18 illustrate by way of example, e.g., real data taken on an XLA system, such as applicants' assignee's XLA XXX lasers. The plot of FIG. 16, e.g., relates to the sensitivity of a laser operating parameter, e.g., the change in the differential firing time, dtMOPA, with respect to change in fluorine concentration, otherwise expressed as $d(\Delta t_{MOPA})/dF2$. as can be seen, the value over time can, e.g., converge to a particular more or less steady state value, e.g., to ~−200 for a determinable period of time, e.g., for about the first $10\times10^7$ shots (100 M shots) and then tend toward another value, e.g., trend steadily towards, e.g., a least sensitive bound, i.e., −50 by a determinable amount of time, e.g., by about 180M shots.

Such a convergence, e.g., to zero may, e.g., be correlated with the end of gas life as defined above. According to aspects of an embodiment of the disclosed subject matter applicants propose apparatus and methods to be able to predict how many shots or hours the laser can operate without reaching the bound or reaching a value within some selected percentage of the bound, e.g., 90% of the bound, so as to, e.g., permit continued laser firing past the gas life spec (e.g., 100 M shots) if the gas can be determined based on review of the data to still be "healthy" enough from a sensitivity standpoint. Such behavior has been observed for gas lives ranging from 100 M shots to over 1 B shots, e.g., on both XLA and similarly on KrF (e.g., 7 XXX) products of applicants' assignee, Cymer, Inc. This could, according to aspects of an embodiment of the disclosed subject matter, be implemented as a metric that, e.g., uses various sensitivities and laser signals to determine when the system is close to the end of gas life, i.e., within some selectable percentage of the value of a boundary and/or within some selectable percentage of time or shots or the like of reaching such a boundary, so that some tolerance factor can be selected to insure that the enhancement of the gas life does not result in unwanted alarms of shutdowns, e.g., due to the laser control system seeing that the bound has been reached or is within some alarm limit of the bound.

It will be understood by those skilled in the art that according to aspects of an embodiment of the disclosed subject matter, a line narrowed high average power high pulse repetition laser micro-photolithography light source bandwidth control method and apparatus are disclosed which may comprise a bandwidth metrology module measuring the bandwidth of a laser output light pulse beam pulse produced by the light source and providing a bandwidth measurement; a bandwidth error signal generator receiving the bandwidth measurement and a bandwidth setpoint and providing a bandwidth error signal; an active bandwidth controller providing a fine bandwidth correction actuator signal and a coarse bandwidth correction actuator signal responsive to the bandwidth error. The fine bandwidth correction actuator and the coarse bandwidth correction actuator each may induce a respective modification of the light source behavior that reduces bandwidth error. The coarse and fine bandwidth correction actuators each may comprise a plurality of bandwidth correction actuators. The coarse bandwidth correction actuator may target large amplitude disturbances occurring at low frequency, e.g., on the order of minutes to months and the fine bandwidth correction actuator may target small amplitude disturbances occurring at high frequency, e.g., on the order of msecs to minutes. The large amplitude disturbances comprising one or more of the group of large $E_{95}$ setpoint changes, which can vary from product to product, gas aging effects and the long timescale (e.g., minutes or more) component of duty cycle setpoint changes, e.g., over 1 minute, and the smaller amplitude disturbances comprising one or more of the group comprising laser system output pulse energy setpoint changes, e.g., of more than 1% of the mJ setting, and the fast component (minutes of less) of duty cycle setpoint changes, e.g., <1 minute. The apparatus and method may comprise fine actuator control output trends toward a minimum or maximum value; coarse actuator control applying corrective action in such a way as to move the fine actuator back towards a centered value. The centered value may comprise nominally 50% where control authority is balanced in both the positive and negative directions. According to aspects of an embodiment of the disclosed subject matter a line narrowed high average power high pulse repetition laser micro-photolithography light source bandwidth control method and apparatus is disclosed which may comprise a laser operating parameter metrology module measuring the laser operating parameter of a laser output light pulse beam pulse produced by the light source and providing a laser operating parameter measurement; a laser operating parameter error signal generator receiving the laser operating parameter measurement and a laser operating parameter setpoint and providing a laser operating parameter error signal; a laser operating parameter error signal modifier modifying the laser operating parameter error signal according to the sensitivity of the laser operating parameter to another laser operating parameter comprising a real time estimation filter. The laser operating parameter error signal modifier may modify the laser operating parameter error signal according to the sensitivity of the laser operating system parameter to each of a plurality of other laser operating parameters. The laser operating parameter may be selected from the group comprising bandwidth ($E_{xx}$, that is, the integral of some portion XX % of the total energy in the spectrum), bandwidth (FWXM, that is, the full width at some portion X % of the maximum, e.g., FWH(alf)M, FW(25%)M, FW(75%)M, etc.), energy out of the seed laser ($E_{MO}$), differential firing time between the seed laser and amplifier gain medium (dtMOPA), and voltage (V). The other laser operating parameter may be selected from the group comprising duty cycle (DC) and laser system output energy, e.g., at the output shutter ($E_{sht}$) and voltage (V). The error signal modifier may comprise a recursive filter, e.g., an RLS filter, which also may implement the following:

$$K \equiv \frac{\lambda^{-1} P[n-1] u[n]}{1 + \lambda^{-1} u^T[n] P[n-1] u[n]}$$

$$e \equiv d[n] - w[n-1] u[n]$$

$$w[n] = w[n-1] + K^T e$$

$$P[n] = \lambda^{-1} P[n-1] - \lambda^{-1} K u^T[n] P[n-1]$$

where d[n] is the current value of the laser parameter error signal, w[n] is the estimate of the sensitivity of the error signal with respect to the other laser operating parameter, u[n] and P[n] together form an estimate of the inverse variance of the other laser operating parameter, λ, is a forgetting factor from 0.0 to 1.0 and n, is a sample index. According to aspects of am embodiment of the disclosed subject matter a line narrowed high average power high pulse repetition laser micro-photolithography light source fluorine injection control method and apparatus may comprise a laser operating parameter measurement mechanism measuring a laser operating parameter of the light source; a laser operating parameter tracking mechanism providing a representation of the value of the laser operating parameter over time; a laser system gas refill prediction mechanism predicting the time for a gas fill based upon the trending of the value of the laser operating parameter between a first relatively constant steady state trend value and a limiting value. The laser operating parameter may be selected from the group comprising voltage (V), differential firing time (dtMOPA), bandwidth at the energy percentage integral, i.e., $E_{95\%}$, $E_{xx\%}$, etc., energy out of the master oscillator, $E_{MO}$, energy out of the amplification gain medium, e.g., PA or PO or other type of amplification gain stage (e.g., dual chamber laser output energy), $E_{PA}$, $E_{PO}$ or E out of any other amplification gain stage, e.g., a ring power amplification stage, of energy out of the laser system, e.g., at the shutter, $E_{sht}$, etc.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE] described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present [TITLE] is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

We claim:

1. A laser source bandwidth control system comprising:
a bandwidth metrology module measuring bandwidth of a laser output and providing a bandwidth measurement;
a bandwidth error signal generator receiving the bandwidth measurement and a bandwidth setpoint and providing a bandwidth error signal;
a coarse bandwidth correction subsystem operable on a first laser component and responding to large amplitude disturbances occurring at low frequency and a fine bandwidth correction subsystem operable on a second laser component, different than the first laser component, and responding to small amplitude disturbances occurring at high frequency; and
an active bandwidth controller providing a signal to the fine bandwidth correction subsystem and a signal to the coarse bandwidth correction subsystem responsive to the bandwidth error signal.

2. The system of claim 1 further comprising:
the coarse and fine bandwidth correction subsystems each comprising a plurality of bandwidth correction actuators.

3. The system of claim 1 further comprising:
the large amplitude disturbances comprising one or more of the group of large $E_{95}$ setpoint changes, gas aging effects and the long timescale component of duty cycle setpoint changes, and the smaller amplitude disturbances comprising one or more of the group comprising laser system output pulse energy setpoint, and the fast component of duty cycle setpoint changes.

4. The system of claim 2 further comprising:
the large amplitude disturbances comprising one or more of the group of large $E_{95}$ setpoint changes, gas aging effects and the long timescale component of duty cycle setpoint changes, and the smaller amplitude disturbances comprising one or more of the group comprising laser system output pulse energy setpoint, and the fast component of duty cycle setpoint changes.

5. The system of claim 1 further comprising:
fine subsystem control output trends towards a minimum or maximum value;
coarse subsystem control applies corrective action in such a way as to move the fine subsystem back towards a centered value.

6. The system of claim 2 further comprising:
fine subsystem control output trends towards a minimum or maximum value;
coarse subsystem control applies corrective action in such a way as to move the fine subsystem back towards a centered value.

7. The system of claim 3 further comprising:
fine subsystem control output trends towards a minimum or maximum value;
coarse subsystem control applies corrective action in such a way as to move the fine subsystem back towards a centered value.

8. The system of claim 4 further comprising:
fine subsystem control output trends towards a minimum or maximum value;
coarse subsystem control applies corrective action in such a way as to move the fine subsystem back towards a centered value.

9. The system of claim 5 further comprising:
the centered value comprises nominally 50% where control authority is balanced in both the positive and negative directions.

10. The system of claim 6 further comprising:
the centered value comprises nominally 50% where control authority is balanced in both the positive and negative directions.

11. The system of claim 7 further comprising:
the centered value comprises nominally 50% where control authority is balanced in both the positive and negative directions.

12. The system of claim 8 further comprising:
the centered value comprises nominally 50% where control authority is balanced in both the positive and negative directions.

13. The system of claim 1 wherein the laser source comprises a gas discharge seed laser and an amplifier and wherein the coarse bandwidth correction subsystem comprises a gas concentration regulator.

14. The system of claim 13 wherein the gas concentration regulator regulates fluorine gas concentration.

15. The system of claim 1 wherein the laser source comprises a gas discharge seed laser having a pulse power supply and an amplifier having a pulse power supply and wherein the fine bandwidth correction subsystem comprises a controller controlling the time delay between commutation of the seed laser pulse power supply and the amplifier pulse power supply.

16. The system of claim 1 wherein the laser source comprises a line narrowing module having a grating and wherein the fine bandwidth correction subsystem comprises a grating curvature adjustor.

17. A method of controlling bandwidth of a laser source control, the method comprising the steps of:
measuring bandwidth of a laser output and providing a bandwidth measurement;
providing a bandwidth error signal from the bandwidth measurement and a bandwidth setpoint and;
providing a coarse bandwidth correction subsystem operable on a first laser component and responsive to large amplitude disturbances occurring at low frequency and a fine bandwidth correction subsystem operable on a second laser component, different than the first laser component, and responding to small amplitude disturbances occurring at high frequency; and
sending signal to the fine bandwidth correction subsystem and signal to the coarse bandwidth correction subsystem responsive to the bandwidth error signal.

18. The method of claim 17 wherein the laser source comprises a gas discharge seed laser and an amplifier and wherein the coarse bandwidth correction subsystem comprises a gas concentration regulator.

19. The method of claim 18 wherein the gas concentration regulator regulates fluorine gas concentration.

20. The method of claim 17 wherein the laser source comprises a gas discharge seed laser having a pulse power supply and an amplifier having a pulse power supply and wherein the fine bandwidth correction subsystem comprises a controller controlling the time delay between commutation of the seed laser pulse power supply and the amplifier pulse power supply.

21. The method of claim 17 wherein the laser source comprises a line narrowing module having a grating and wherein the fine bandwidth correction subsystem comprises a grating curvature adjustor.

* * * * *